United States Patent
Wu et al.

(10) Patent No.: US 9,324,381 B2
(45) Date of Patent: Apr. 26, 2016

(54) ANTIFUSE OTP MEMORY CELL WITH PERFORMANCE IMPROVEMENT, AND MANUFACTURING METHOD AND OPERATING METHOD OF MEMORY

(71) Applicant: eMemory Technology Inc., Hsinchu (TW)

(72) Inventors: Meng-Yi Wu, Hsinchu County (TW); Hsin-Ming Chen, Hsinchu (TW); Chun-Hung Lu, Hsinchu (TW)

(73) Assignee: eMemory Technology Inc., Hsinchu (TW)

(*) Notice: Subject to any disclaimer, the term of this patent is extended or adjusted under 35 U.S.C. 154(b) by 0 days.

(21) Appl. No.: 14/606,032

(22) Filed: Jan. 27, 2015

(65) Prior Publication Data

US 2015/0287730 A1  Oct. 8, 2015

Related U.S. Application Data

(60) Provisional application No. 61/973,867, filed on Apr. 2, 2014.

(51) Int. Cl.

| | | |
|---|---|---|
| *G11C 17/16* | (2006.01) | |
| *G11C 5/06* | (2006.01) | |
| *G11C 16/04* | (2006.01) | |
| *G11C 17/18* | (2006.01) | |
| *H01L 27/112* | (2006.01) | |
| *H01L 29/423* | (2006.01) | |

(Continued)

(52) U.S. Cl.
CPC .............. *G11C 5/06* (2013.01); *G11C 16/0408* (2013.01); *G11C 17/16* (2013.01); *G11C 17/18* (2013.01); *H01L 27/11206* (2013.01); *H01L 27/11529* (2013.01); *H01L 27/11573* (2013.01); *H01L 29/42368* (2013.01); *H01L 29/512* (2013.01); *H01L 29/7817* (2013.01); *H01L 29/7835* (2013.01); *H01L 23/5252* (2013.01); *H01L 29/93* (2013.01)

(58) Field of Classification Search
USPC .......................................................... 365/96
See application file for complete search history.

(56) References Cited

U.S. PATENT DOCUMENTS 5,163,180 A * 11/1992 Eltoukhy ............ H01L 23/5252
                                                      257/408
5,331,196 A *  7/1994 Lowrey ................. H01L 27/112
                                                      257/529

(Continued)

FOREIGN PATENT DOCUMENTS

EP          2541600           1/2013

OTHER PUBLICATIONS

"Office Action of Europe Counterpart Application", issued on Jan. 14, 2016, p.1-12.

*Primary Examiner* — Hoai V Ho
*Assistant Examiner* — Minh Dinh
(74) *Attorney, Agent, or Firm* — Jianq Chyun IP Office

(57) ABSTRACT

An OTP memory cell including an antifuse unit and a select transistor is provided. The antifuse unit includes an antifuse layer and an antifuse gate disposed on a substrate in sequence, a modified extension doped region disposed in the substrate below the antifuse layer, and a first doped region and a second doped region disposed in the substrate at two opposite sides of the antifuse gate. The select transistor includes a select gate, a gate dielectric layer, a second doped region, and a third doped region. The select gate is disposed on the substrate. The gate dielectric layer is disposed between the select gate and the substrate. The second and the third doped region are respectively disposed in the substrate at two opposite sides of the select gate. The doped region, the antifuse layer and the antifuse gate form a varactor.

22 Claims, 8 Drawing Sheets

(51) Int. Cl.
  *H01L 29/78* (2006.01)
  *H01L 27/115* (2006.01)
  *H01L 29/51* (2006.01)
  *H01L 23/525* (2006.01)
  *H01L 29/93* (2006.01)

(56) References Cited

U.S. PATENT DOCUMENTS

| | | |
|---|---|---|
| 6,798,693 B2 | 9/2004 | Peng |
| 6,822,888 B2 | 11/2004 | Peng |
| 8,174,063 B2 * | 5/2012 | Lu .................... H01L 21/28282 257/314 |
| 8,344,445 B2 * | 1/2013 | Lu ........................ G11C 17/16 257/314 |
| 2006/0203591 A1 | 9/2006 | Lee |
| 2007/0008800 A1 | 1/2007 | Jenne |
| 2009/0250726 A1 | 10/2009 | Kurjanowicz |
| 2011/0108923 A1 | 5/2011 | Kubota et al. |
| 2011/0210397 A1 | 9/2011 | Hui et al. |
| 2014/0340955 A1 | 11/2014 | Wu et al. |

* cited by examiner

ANTIFUSE OTP MEMORY CELL WITH PERFORMANCE IMPROVEMENT, AND MANUFACTURING METHOD AND OPERATING METHOD OF MEMORY

CROSS-REFERENCE TO RELATED APPLICATION

This application claims the priority benefits of U.S. provisional application Ser. No. 61/973,867, filed on Apr. 2, 2014. The entirety of the above-mentioned patent application is hereby incorporated by reference herein and made a part of this specification.

BACKGROUND

1. Technical Field

The invention relates to a memory, and a manufacturing method and an operating method thereof. More particularly, the invention relates to an antifuse OTP memory cell with performance improvement, and a manufacturing method and an operating method of a memory.

2. Related Art

A non-volatile memory is a type of memory that retains information it stores even when the power supply is cut off. The non-volatile memory may be classified into a read-only memory (ROM), a one-time programmable memory (OTP memory), and a rewritable memory. Moreover, the semiconductor memory technology has progressed to the point where the non-volatile memory can be implemented with the same process as a complementary metal oxide semiconductor (CMOS) device.

The OTP memory described above may be classified into a fuse type and an anti-fuse type. The fuse type OTP memory is short before being programmed and open after being programmed. On the contrary, the anti-fuse type OTP memory is open before being programmed and short after being programmed. Moreover, based on the characteristics of the metal-oxide semiconductor (MOS) device in CMOS fabrication process, the anti-fuse OTP memory is more suitable to be implemented with the CMOS fabrication process.

Moreover, the OTP memory unit forms a permanent conductive path on the ruptured gate oxide layer. Furthermore, the forming location of the permanent conductive path changes with variations in the fabrication process. Therefore, operating methods of the OTP memory unit usually result in erroneous judgments due to different forming locations of the conductive path.

SUMMARY

The invention provides an antifuse one-time programmable (OTP) memory cell with performance improvement. The antifuse OTP memory cell with performance improvement can prevent yield loss caused by a rupture location of an antifuse layer being in a location where an antifuse gate and a substrate are in direct contact.

The invention provides an operating method of a memory. The operating method of a memory can read by using less voltage, lower PGM inhibit current, and improve program leakage current.

The invention provides an antifuse OTP memory cell with performance improvement including an antifuse unit and a select transistor. The antifuse unit is disposed on a substrate, and the substrate has a first conductive type. The antifuse unit includes an antifuse gate, an antifuse layer, a modified extension doped region, a first doped region and a second doped region. The antifuse gate is disposed on the substrate. The antifuse layer is disposed between the antifuse gate and the substrate. The modified extension doped region has a second conductive type, and is disposed in the substrate below the antifuse layer, where the antifuse layer, the antifuse gate and the modified extension doped region form a varactor. The first doped region and the second doped region has the second conductive type, and are respectively disposed in the substrate at two opposite sides of the antifuse gate. The select transistor is disposed on the substrate and includes a select gate, a gate dielectric layer, the second doped region and a third doped region. The select gate is disposed on the substrate. The gate dielectric layer is disposed between the select gate and the substrate. The second doped region and the third doped region have the second conductive type, and are respectively disposed in the substrate at two opposite sides of the select gate.

In an embodiment of the invention, a thickness of the antifuse layer is the same to a thickness of the gate dielectric layer.

In an embodiment of the invention, the select transistor includes a core metal oxide semiconductor (MOS) transistor, where the select transistor has a lightly doped region and a source/drain extension. The lightly doped region has the second conductive type, and is disposed between the select gate and the second doped region, where a junction depth of the lightly doped region is the same to a junction depth of the modified extension doped region, and a doping concentration of the lightly doped region is the same to a doping concentration of the modified extension doped region. The source/drain extension has the second conductive type, and is disposed between the select gate and the third doped region, where a junction depth of the source/drain extension is smaller than a junction depth of the modified extension doped region, and a doping concentration of the source/drain extension is greater than the doping concentration of the modified extension doped region.

In an embodiment of the invention, the select transistor includes an input/output (I/O) MOS transistor. The select transistor has a lightly doped region and a source/drain extension. The lightly doped region has the second conductive type, and is disposed between the select gate and the second doped region. The source/drain extension has the second conductive type, and is disposed between the select gate and the third doped region. Junction depths of the lightly doped region, the source/drain extension and the modified extension doped region are the same, and doping concentrations of the lightly doped region, the source/drain extension and the modified extension doped region are the same.

In an embodiment of the invention, the select transistor includes a dual gate dielectric layer MOS transistor, where a thickness of the gate dielectric layer close to the second doped region is greater than a thickness of the gate dielectric layer close to the third doped region. The select transistor has a lightly doped region and a source/drain extension. The lightly doped region has the second conductive type, and is disposed between the select gate and the second doped region, where a junction depth of the lightly doped region is the same to a junction depth of the modified extension doped region, and a doping concentration of the lightly doped region is the same to a doping concentration of the modified extension doped region. The source/drain extension has the second conductive type, and is disposed between the select gate and the third doped region, where a junction depth of the source/drain extension is smaller than a junction depth of the modified extension doped region, and a doping concentration of the source/drain extension is greater than the doping concentration of the modified extension doped region.

In an embodiment of the invention, the first conductive type is one of a P-type and an N-type, and the second conductive type is another one of the P-type and the N-type.

In an embodiment of the invention, the modified extension doped region is a well. A part of the well extends to the bottom of the select gate. The select transistor is a core MOS transistor or the select transistor includes an I/O MOS transistor. The select transistor has a lightly doped region. The lightly doped region has the second conductive type, and is disposed between the select gate and the third doped region.

In an embodiment of the invention, a part of the well extends to the bottom of the second doped region. The select transistor includes a dual gate dielectric layer MOS transistor, where a thickness of the gate dielectric layer close to the second doped region is greater than a thickness of the gate dielectric layer close to the third doped region. The select transistor has a lightly doped region and a source/drain extension. The lightly doped region has the second conductive type, and is disposed between the select gate and the second doped region. The source/drain extension has the second conductive type, and is disposed between the select gate and the third doped region, where a junction depth of the source/drain extension is smaller than a junction depth of the lightly doped region, and a doping concentration of the source/drain extension is greater than the doping concentration of the lightly doped region.

The invention provides an operating method of a memory cell, the memory cell includes a select transistor disposed on a substrate, and an antifuse unit connected to the select transistor in series, where the antifuse unit includes an antifuse layer and an antifuse gate disposed on the substrate in sequence, a modified extension doped region disposed in the substrate below the antifuse layer, and a first doped region and a second doped region disposed in the substrate at two opposite sides of the antifuse gate, the antifuse layer, the antifuse gate and the modified extension doped region form a varactor; the select transistor includes a select gate, and a second doped region and a third doped region respectively disposed in the substrate at two opposite sides of the select gate. The operating method of the memory cell includes following step. In a read operation, a first voltage is applied to the select gate, and a second voltage is applied to the third doped region and applying a third voltage to the antifuse gate, where the first voltage is enough to turn on a channel of the select transistor, and data stored in the memory cell is determined by detecting a channel current of the memory cell through the antifuse gate.

In an embodiment of the invention, the first voltage is equal to the third voltage, and the second voltage is 0V.

The invention provides an operating method of a memory, the memory includes a plurality of memory cells arranged in an array, each of the memory cells includes a select transistor disposed on a substrate, and an antifuse unit connected to the select transistor in series, where the antifuse unit includes an antifuse layer and an antifuse gate disposed on the substrate in sequence, a modified extension doped region disposed in the substrate below the antifuse layer, and a first doped region and a second doped region respectively disposed in the substrate at two opposite sides of the antifuse gate, the antifuse gate, the antifuse layer and the modified extension doped region form a varactor; the select transistor includes a select gate, and a second doped region and a third doped region respectively disposed in the substrate at two opposite sides of the select gate; a plurality of word lines respectively connected to the select gate of the memory cells of the same row; a plurality of antifuse gate lines respectively connected to the antifuse gate of the memory cells of the same row; a plurality of bit lines respectively connected to the third doped region of the memory cells of a same row. The operating method of the memory cell includes following step. In a read operation, a first voltage is applied to the word line coupled to the selected memory cell, a second voltage is applied to the bit line coupled to the selected memory cell and applying a third voltage to the antifuse gate line to the selected memory cell, where the first voltage is enough to turn on a channel of the select transistor of the selected memory cell, and data stored in the selected memory cell is determined by detecting a channel current of the selected memory cell through the antifuse gate coupled to the selected memory cell.

In an embodiment of the invention, the first voltage is equal to the third voltage, and the second voltage is 0V.

The invention provides a method for manufacturing an antifuse OTP memory cell with performance improvement, which includes following steps. An antifuse structure and a select gate structure are formed, the antifuse structure includes an antifuse layer and an antifuse gate formed on a substrate in sequence, the select gate structure includes a gate dielectric layer and a select gate formed on the substrate in sequence. A modified extension doped region is formed in the substrate below the antifuse layer, where the antifuse layer, the antifuse gate and the modified extension doped region form a varactor. A first doped region and a second doped region are formed in the substrate at two opposite sides of the antifuse gate, and a second doped region and a third doped region are formed in the substrate at two opposite sides of the select gate.

In an embodiment of the invention, a step of forming the modified extension doped region includes performing a tilt angle ion implantation.

In an embodiment of the invention, the method for manufacturing an antifuse OTP memory cell with performance improvement further includes following steps. A lightly doped region is formed between the select gate and the second doped region, and a source/drain extension is formed between the select gate and the third doped region.

In an embodiment of the invention, the lightly doped region and the modified extension doped region are formed in a same step.

In an embodiment of the invention, the modified extension doped region is a well, and the modified extension doped region is formed before the antifuse structure and the select gate structure are formed.

In an embodiment of the invention, a part of the well extends to the bottom of the select gate. The method for manufacturing an antifuse OTP memory cell with performance improvement further includes forming a lightly doped region between the select gate and the third doped region.

In an embodiment of the invention, a part of the well extends to the bottom of the second doped region.

In an embodiment of the invention, in the step of forming the gate dielectric layer, a thickness of the gate dielectric layer close to the second doped region is made to be greater than a thickness of the gate dielectric layer close to the third doped region; a lightly doped region is formed between the select gate and the second doped region; and a source/drain extension is formed between the select gate and the third doped region, where a junction depth of the source/drain extension is smaller than a junction depth of the first doped region, and a doping concentration of the source/drain extension is greater than a doping concentration of the first doped region.

According to the above descriptions, in the antifuse OTP memory cell with performance improvement, the manufacturing method thereof, the operating method thereof and the operating method of the memory, the antifuse gate, the antifuse layer and the modified extension doped region (the well) form a varactor. The modified extension doped region (the well) is used to connect the second doped region, where the conductive types of the modified extension doped region (the well) and the second doped region are the same, i.e. a rupture position of the antifuse layer is formed at a position far away from the second doped region, and the current is conducted to the second doped region through the modified extension doped region (the well), so as to improve a reading characteristic. When the antifuse memory cell is read, the read operation can be performed through a lower voltage. When the antifuse memory cell is programmed, a PGM inhibit current is decreased during inhibit programming.

Moreover, since the modified extension doped region (the well) is disposed in the substrate under below the antifuse unit, direct contact between the antifuse gate and the substrate after rupture of the antifuse layer is avoided, and when the antifuse memory cell is programmed, the PGM inhibit current is decreased.

Moreover, when the select transistor is an I/O MOS transistor, the thickness of the gate dielectric layer is higher than the thickness of the antifuse layer, by which the leakage current is decreased during inhibit programming.

When the select transistor is a dual gate dielectric layer MOS transistor, the thickness of the gate dielectric layer close to the antifuse layer is higher than the thickness of the antifuse layer, by which the leakage current is decreased during inhibit programming.

In the antifuse memory cell of the invention, a junction depth of the lightly doped region is higher than a junction depth of a source/drain extending region of the core MOS transistor, and a doping concentration of the lightly doped region is smaller than a doping concentration of the source/drain extending region of the core MOS transistor, junction BVD (i.e. the breakdown voltage of the drain to substrate junction) is improved. Further, by the lightly doped region, the leakage current is improved. Moreover, the lightly doped drain of the I/O MOS transistor is directly used as the lightly doped region.

Moreover, when the select transistor is the I/O MOS transistor, and the modified extension doped region (the well) further extends from the bottom of the antifuse unit to the bottom of the select gate, the leakage current is decreased during inhibit programming.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
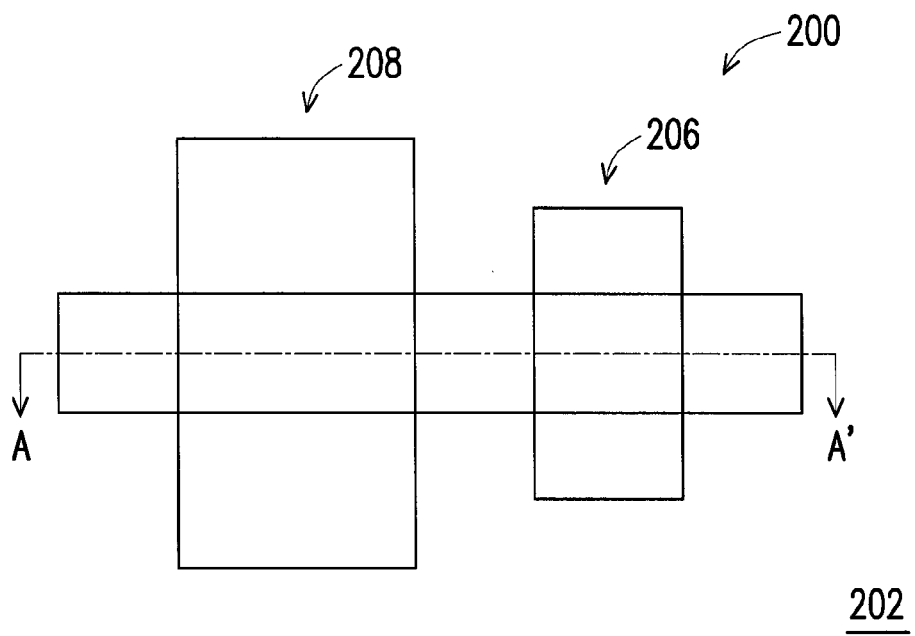
FIG. 1A is a top view of a memory cell according to an exemplary embodiment of the invention.
Figure 1B:
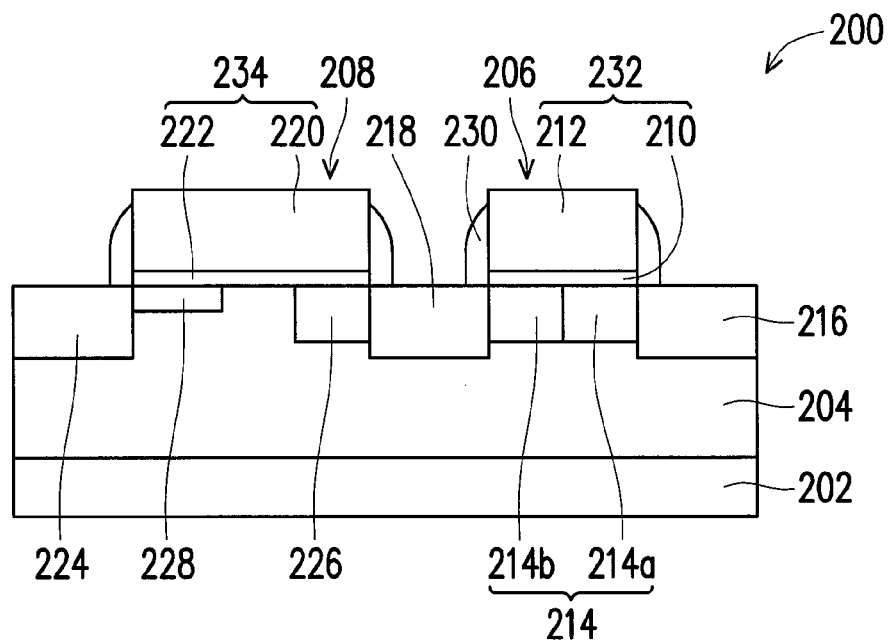
FIG. 1B is a cross-sectional view of the memory cell of FIG. 1A viewing along a section line A-A' according to an exemplary embodiment of the invention.

FIG. 1A is a top view of a memory cell according to an exemplary embodiment of the invention. FIG. 1B is a cross-sectional view of the memory cell of FIG. 1A viewing along a section line A-A' according to an exemplary embodiment of the invention.

Referring to FIG. 1A and FIG. 1B, the antifuse memory cell 200 of the present embodiment is, for example, disposed on the substrate 202. The substrate 202, for example, has a first conductive type.

The antifuse memory cell 200 of the present embodiment includes an antifuse unit 206 and a select transistor 208.

The antifuse unit 206 is disposed on the substrate 202. The antifuse unit 206 includes an antifuse layer 210, an antifuse gate 212, a modified extension doped region 214, a doped region 216 (source/drain) and a doped region 218 (source/drain).

The antifuse gate 212 is disposed on the substrate 202. The antifuse layer 210 is disposed between the antifuse gate 212 and the substrate 202. A material of the antifuse layer 210 is, for example, silicon oxide or other insulation layer capable of forming the gate oxide layer (for example, an oxide layer with high dielectric constant such as $HfO_2$, $Al_2O_3$, etc.). The programming operation is implemented through rupture of the antifuse layer 210 under the antifuse gate 212.

The modified extension doped region 214 has the second conductive type, and is disposed in the substrate 202 below the antifuse layer 210. The modified extension doped region 214 is composed of a doped region 214a and a doped region 214b. The modified extension doped region 214a and the modified extension doped region 214b are modified source/drain extension regions. The antifuse layer 210, the antifuse gate 212 and the modified extension doped region 214 form a varactor.

The doped region 216 (source/drain) and the doped region 218 (source/drain) has the second conductive type, and are respectively disposed in the substrate 202 at two opposite sides of the antifuse gate 212.

The select transistor 208 is disposed on the substrate 202, and includes a select gate 220, a gate dielectric layer 222, a doped region 218 and a doped region 224. The select gate 220 is, for example, disposed on the substrate 202.

The gate dielectric layer 222 is, for example, disposed between the select gate 220 and the substrate 202. A material of the gate dielectric layer 222 is, for example, silicon oxide or other insulation layer capable of forming the gate oxide layer (for example, an oxide layer with high dielectric constant such as $HfO_2$, $Al_2O_3$, etc.). A thickness of the antifuse layer 210 and a thickness of the gate dielectric layer 222 are the same or different.

The doped region 218 and the doped region 224 have the second conductive type, and are disposed in the substrate 202 at two opposite sides of the select gate 220, where the antifuse unit 206 and the select transistor 208 share the doped region 218.

In the present embodiment, the select transistor 208 is, for example, a core metal oxide semiconductor (MOS) transistor. The select transistor 208 has a lightly doped region 226 and a source/drain extension (SDE) 228. The lightly doped region 226 is disposed between the select gate 220 and the doped region 218, where a junction depth of the lightly doped region 226 is the same or different to a junction depth of the modified extension doped region 214, and a doping concentration of the lightly doped region 226 is the same or different to a doping concentration of the modified extension doped region 214. The source/drain extension 228 is disposed between the select gate 220 and the modified extension doped region 224, where a junction depth of the source/drain extension 228 is smaller than a junction depth of the modified extension doped region 214, and a doping concentration of the source/drain extension 228 is greater than a doping concentration of the modified extension doped region 214.

In an embodiment, the source/drain extension 228 is a source/drain extension region of the core MOS transistor. The lightly doped region 226 is a modified source/drain extension region, a junction depth of the lightly doped region 226 is greater than a junction depth of the source/drain extension 228, and a doping concentration of the lightly doped region 226 is usually smaller than a doping concentration of the source/drain extension 228. The junction depth and the doping concentration of the lightly doped region 226 are, for example, the same with that of a lightly doped drain (IOLDD) of an input/output (I/O) MOS transistor.

Taking a 40 nm process as an example, when the select transistor is a core MOS transistor, the thickness of the gate dielectric layer 222 is, for example, 20 Å-30 Å, and the doping concentration of the source/drain extension 228 is, for example, $5*10^{13}$–$2*10^{15}(1/cm^2)$. When the select transistor is an I/O MOS transistor, the thickness of the gate dielectric layer 222 is, for example, 50 Å-70 Å, and the doping concentration of the lightly doped region 226 is, for example, $5*10^{12}$–$1*10^{14}(1/cm^2)$.

Since the junction depth of the lightly doped region 226 is greater than the junction depth of the source/drain extension 228, junction BVD (the breakdown voltage of the drain to substrate junction) is improved, and the program leakage current is improved.

In the antifuse memory cell of the invention, a well 204 having the first conductive type can be configured according to an actual requirement.

In the antifuse memory cell of the invention, a spacer 230 can be configured according to an actual requirement. The spacer 230 is disposed at sidewalls of the select gate 220 and the antifuse gate 212.

In the above embodiment, if the first conductive type is P-type, the second conductive type is N-type; and if the first conductive type is N-type, the second conductive type is P-type.

Referring to FIG. 1B, a method for manufacturing the memory cell of an exemplary embodiment of the invention is introduced below. First, the well 204 is formed in the substrate 202. An antifuse structure 232 composed of the antifuse layer 210 and the antifuse gate 212 and a select gate structure 234 composed of the gate dielectric layer 222 and the select gate 220 are formed on the substrate 202.

The source/drain extension 228 is formed at one side of the select gate 220. A method of forming the source/drain extension 228 is, for example, ion implantation. A mask layer (not shown) is used to cover the source/drain extension 228.

Then, the modified extension doped region 214 is formed in the substrate 202 below the antifuse layer 210, and the lightly doped region 226 is formed at another side of the select gate 220. The antifuse gate 212, the antifuse layer 210 and the modified extension doped region 214 form a varactor. A method for forming the lightly doped region 226 and the modified extension doped region 214 is tilt angle ion implantation. The doped region 214a and the doped region 214b are formed in the substrate 202 below the antifuse gate 212 through the tilt angle ion implantation, and by adjusting an implantation angle, the doped region 214a and the doped region 214b are connected to form the modified extension doped region 214. In the present embodiment, the lightly doped region 226 and the modified extension doped region 214 are formed in a same step, though in other embodiments, the lightly doped region 226 and the modified extension doped region 214 can also be formed in different steps.

The mask layer (not shown) covering the source/drain extension 228 is removed. Then, the doped region 216 and the doped region 218 are formed in the substrate 202 at two opposite sides of the antifuse gate 212, and the doped region 218 and the dope region 224 are formed in the substrate 202 at two opposite sides of the select gate 220. The antifuse OTP memory of the invention can be integrated in a CMOS process technique.

Figure 1C:
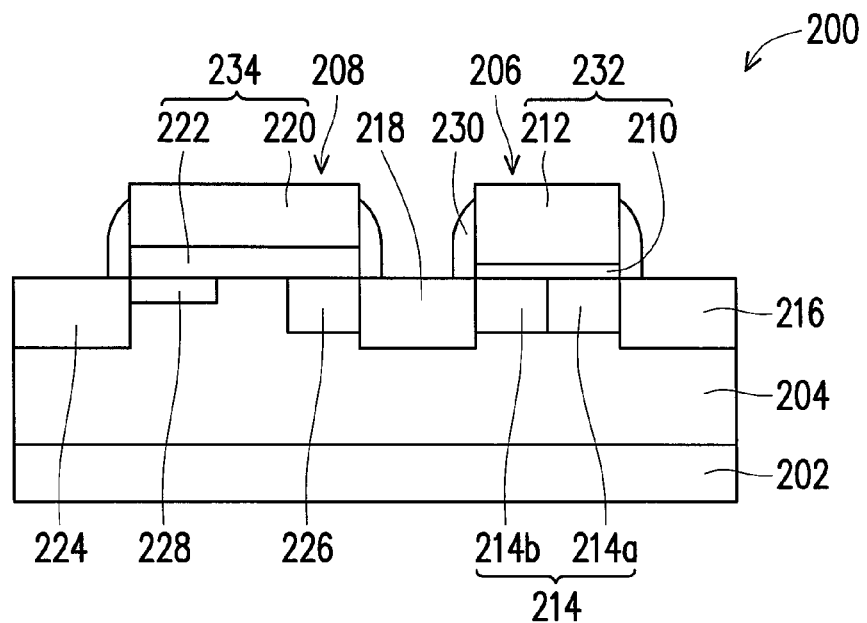
FIG. 1C is a cross-sectional view of the memory cell of FIG. 1A viewing along the section line A-A' according to an exemplary embodiment of the invention.

FIG. 1C is a cross-sectional view of the memory cell of FIG. 1A viewing along the section line A-A' according to an exemplary embodiment of the invention.

In the present embodiment, the same reference numbers in FIG. 1B and FIG. 1C denote the same or like components, and descriptions of the same technical contents are omitted.

Referring to FIG. 1C, compared to the antifuse memory cell of FIG. 1B, the select transistor 208 of the antifuse memory cell of the present embodiment is, for example, an I/O MOS transistor. The select transistor 208 has a lightly doped region 226 and a source/drain extension 228. The lightly doped region 226 is disposed between the select gate 220 and the doped region 218. The source/drain extension 228 is disposed between the select gate 220 and the doped region 224. A junction depth of the lightly doped region 226 and the source/drain extension 228 can be smaller than or equal to a junction depth of the modified extension doped region 214, and a doping concentration of the lightly doped region 226 and the source/drain extension 228 can be greater than or equal to a doping concentration of the modified extension doped region 214. The lightly doped region 226 and the source/drain extension 228 are the same to a lightly doped drain (IOLDD) of an I/O MOS transistor. The junction depth and the doping concentration of the modified extension doped region 214 are, for example, the same with that of the lightly doped drain (IOLDD) of the I/O MOS transistor.

Taking the 40 nm process as an example, when the select transistor is an I/O MOS transistor, the thickness of the gate dielectric layer 222 is, for example, 50 Å-70 Å, and the doping concentration of the lightly doped region 226 is, for example, $5*10^{12}-1*10^{14}(1/cm^2)$.

Since the junction depth of the lightly doped drain (IOLDD) of the I/O MOS transistor is greater than the junction depth of the source/drain extension region of the core MOS transistor, the lightly doped drain (IOLDD) of the I/O MOS transistor can directly serve as the modified extension doped region 214 (the modified source/drain extension region) of the antifuse unit 206, so as to improve the junction BVD (the breakdown voltage of the drain to substrate junction), and improve the program leakage current.

Certainly, compared to the lightly doped drain (IOLDD) of the I/O MOS transistor, the modified extension doped region 214 (the modified source/drain extension region) of the antifuse unit 206 may have higher junction depth and smaller doping concentration.

Referring to FIG. 1C, a method for manufacturing the memory cell of an exemplary embodiment of the invention is introduced. In the present embodiment, the steps of the method for manufacturing the memory cell are the same to the steps of the method shown in FIG. 1B, so that details thereof are not repeated, and only differences there between are described below.

The antifuse structure 232 composed of the antifuse layer 210 and the antifuse gate 212 and the select gate structure 234 composed of the gate dielectric layer 222 and the select gate 220 are formed on the substrate 202.

The lightly doped region 226 and the source/drain extension 228 are formed at two opposite sides of the select gate 220. A method of forming the source/drain extension 228 is, for example, ion implantation.

In the step of forming the lightly doped region 226 and the source/drain extension 228, the modified extension doped region 214 is simultaneously formed in the substrate 202 below the antifuse layer 210. The antifuse gate 212, the antifuse layer 210 and the modified extension doped region 214 form a varactor. A method for forming the lightly doped region 226, the source/drain extension 228 and the modified extension doped region 214 is tilt angle ion implantation. The doped region 214a and the doped region 214b are formed in the substrate 202 below the antifuse gate 212 through the tilt angle ion implantation, and by adjusting an implantation angle, the doped region 214a and the doped region 214b are connected to form the modified extension doped region 214. Thereafter, the doped region 216, the doped region 218 and the doped region 224 are formed.

In the present embodiment, the lightly doped region 226 and the modified extension doped region 214 are formed in a same step, though in other embodiments, the lightly doped region 226, the source/drain extension 228 and the modified extension doped region 214 can also be formed in different steps. Namely, after the lightly doped region 226 and the source/drain extension 228 are formed, a mask layer (not shown) is used to cover the lightly doped region 226 and the source/drain extension 228. After the modified extension doped region 214 is formed in the substrate 202 below the antifuse layer 210, the mask layer (not shown) covering the source/drain extension 228 is removed.

Figure 1D:
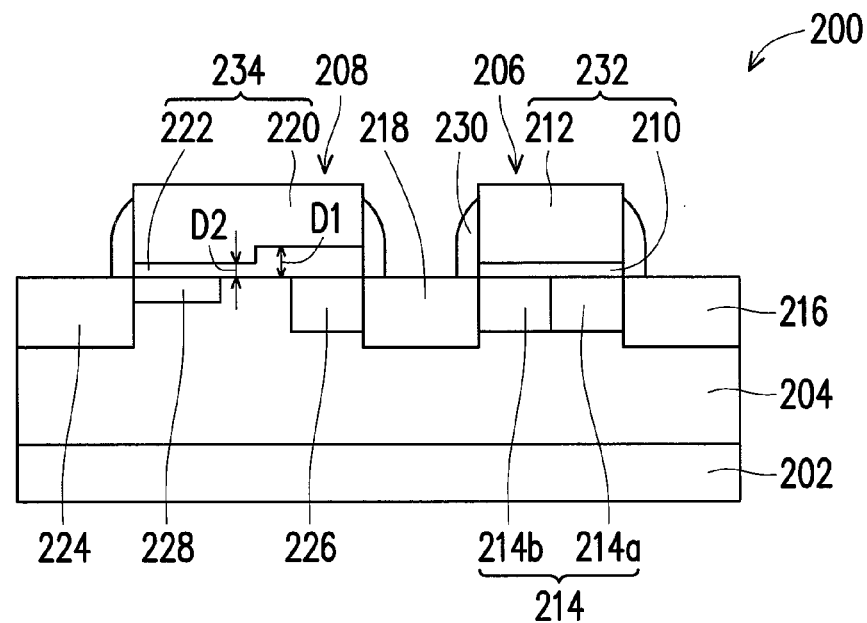
FIG. 1D is a cross-sectional view of the memory cell of FIG. 1A viewing along the section line A-A' according to an exemplary embodiment of the invention.

FIG. 1D is a cross-sectional view of the memory cell of FIG. 1A viewing along the section line A-A' according to an exemplary embodiment of the invention.

Figure 2A:
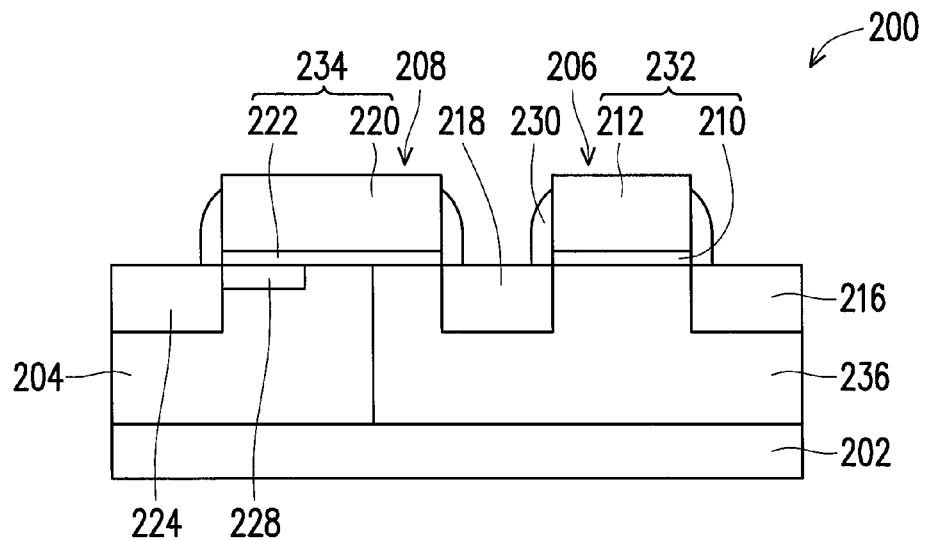
FIG. 2A is a cross-sectional view of the memory cell of FIG. 1A viewing along the section line A-A' according to an exemplary embodiment of the invention.
Figure 2B:
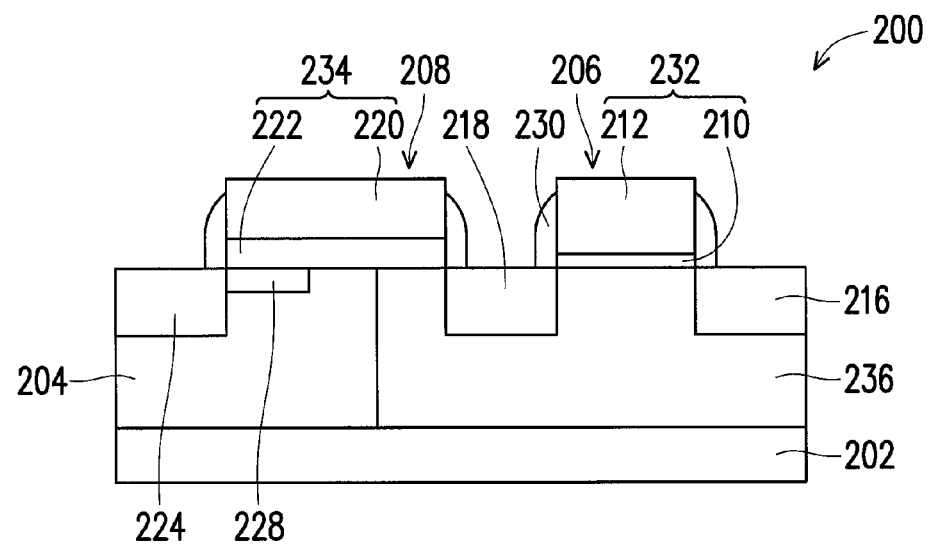
FIG. 2B is a cross-sectional view of the memory cell of FIG. 1A viewing along the section line A-A' according to an exemplary embodiment of the invention.

In the present embodiment, the same reference numbers in FIG. 2B and FIG. 1D denote the same or like components, and descriptions of the same technical contents are omitted.

Referring to FIG. 1D, compared to the antifuse memory cell of FIG. 1B, the select transistor 208 of the antifuse memory cell of the present embodiment is, for example, a dual gate dielectric layer MOS transistor. The part of the select transistor 208 close to the antifuse unit 206 is the I/O MOS transistor, and the part of the select transistor 208 away from the antifuse unit 206 is the core MOS transistor. Therefore, a thickness D1 of the gate dielectric layer 222 close to the modified extension doped region 218 is greater than a thickness D2 of the gate dielectric layer 222 close to the doped region 224. The junction depth of the lightly doped region 226 is the same to the junction depth of the modified extension doped region 214, and the doping concentration of the lightly doped region 226 is the same to the doping concentration of the modified extension doped region 214. The junction depth of the source/drain extension 228 is smaller than the junction depth of the modified extension doped region 214, and the doping concentration of the source/drain extension 228 is greater than the doping concentration of the modified extension doped region 214.

In the present embodiment, the dual gate dielectric layer MOS transistor is, for example, composed of a half of the core MOS transistor and a half of the I/O MOS transistor. The lightly doped region 226 is the lightly doped region (IOLDD) of the I/O MOS transistor. The junction depth and the doped concentration of the modified extension doped region 214 are, for example, the same with that of the lightly doped drain (IOLDD) of the I/O MOS transistor. The source/drain extension 228 is a source/drain extension region of the core MOS transistor.

Referring to FIG. 1D, a method for manufacturing the memory cell of an exemplary embodiment of the invention is introduced. In the present embodiment, the steps of the method for manufacturing the memory cell are the same to the steps of the method shown in FIG. 1B, so that details thereof are not repeated, and only differences there between are described below.

The antifuse structure 232 composed of the antifuse layer 210 and the antifuse gate 212 and the select gate structure 234 composed of the gate dielectric layer 222 and the select gate 220 are formed on the substrate 202. In the step of forming the gate dielectric layer 222, the thickness D1 of the gate dielectric layer 222 close to the antifuse layer 210 is greater than the thickness D2 of the gate dielectric layer 222 away from the antifuse layer 210.

The source/drain extension 228 is formed at a side of the select gate 220. Then, the modified extension doped region 214 is formed in the substrate 202 below the antifuse layer 210, and the lightly doped region 226 is formed at another side of the select gate 220.

Then, the doped region 216 and the doped region 218 are formed in the substrate 202 at two opposite sides of the antifuse gate 212, and the doped region 218 and the doped region 224 are formed in the substrate 202 at two opposite sides of the select gate 220.

In the present embodiment, the lightly doped region 226 and the modified extension doped region 214 are formed in a same step, though in other embodiments, the lightly doped region 226 and the modified extension doped region 214 can also be formed in different steps. The antifuse OTP memory of the invention can be integrated to the CMOS process technique.

Figure 2C:
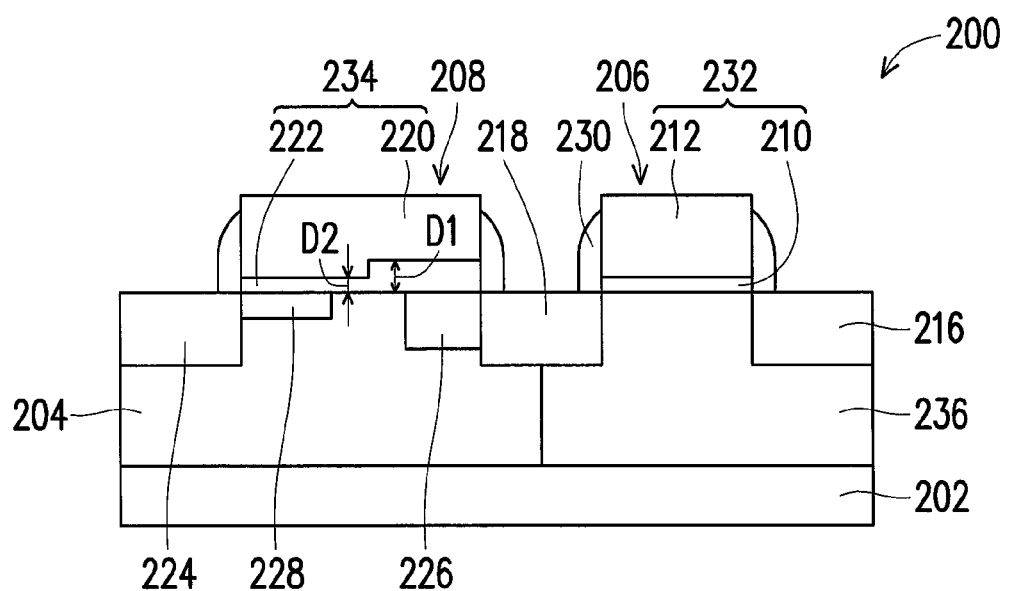
FIG. 2C is a cross-sectional view of the memory cell of FIG. 1A viewing along the section line A-A' according to an exemplary embodiment of the invention.

FIG. 2A to FIG. 2C are cross-sectional views of an antifuse memory cell according to other embodiments of the invention, and FIG. 2A to FIG. 2C are cross-sectional views of the memory cell of FIG. 1A viewing along a section line A-A' according to an exemplary embodiment of the invention.

In the present embodiment, the same reference numbers in FIG. 2A-FIG. 2C and FIG. 1A-1D denote the same or like components, and descriptions of the same technical contents are omitted.

Referring to FIG. 2A, compared to the antifuse memory cell of FIG. 1B, the modified extension doped region of the antifuse memory cell of the present embodiment is the well 236. Besides that the well 236 is disposed in the substrate 202 below the antifuse unit 206, a part of the well 236 extends to the bottom of the select gate 220. Therefore, the lightly doped region 226 shown in FIG. 1B is not configured to the select transistor 208.

Referring to FIG. 2A, a method for manufacturing the memory cell of an exemplary embodiment of the invention is described below. First, the well 204 and the well 236 are respectively formed in the substrate 202, where conductive types of the well 204 and the well 236 are different. The antifuse structure 232 composed of the antifuse layer 210 and the antifuse gate 212 and the select gate structure 234 composed of the gate dielectric layer 222 and the select gate 220 are formed on the substrate 202. A part of the well 236 extends to the bottom of the select gate 220. Then, the source/drain extension 228 is formed at one side of the select gate 220. Then, the doped region 216 and the doped region 218 are formed in the substrate 202 at two opposite sides of the antifuse gate 212, and the doped region 218 and the doped region 224 are formed in the substrate 202 at two opposite sides of the select gate 220. The antifuse OTP memory of the invention can be integrated to the CMOS process technique.

Referring to FIG. 2B, compared to the antifuse memory cell of FIG. 1C, the modified extension doped region of the antifuse memory cell of the present embodiment is the well 236, and besides that the well 236 is disposed in the substrate 202 below the antifuse unit 206, a part of the well 236 extends to the bottom of the select gate 220. Therefore, the lightly doped region 226 shown in FIG. 2B is not configured to the select transistor 208.

Referring to FIG. 2B, a method for manufacturing the memory cell of an exemplary embodiment of the invention is described below. In the present embodiment, the steps of the method for manufacturing the memory cell are the same to the steps of the method shown in FIG. 2A, so that details thereof are not repeated, and only differences there between are described below.

A difference between the method for manufacturing the memory cell of the present embodiment and the method for manufacturing the antifuse memory cell of FIG. 2A only lies in different thickness of the gate dielectric layer, and different junction depths and implantation concentrations of the source/drain extension 228.

Referring to FIG. 2C, compared to the antifuse memory cell of FIG. 1D, the modified extension doped region of the antifuse memory cell of the present embodiment is the well 236, and besides that the well 236 is disposed in the substrate 202 below the antifuse unit 206, a part of the well 236 extends to the bottom of the doped region 218.

The well 236 is disposed in the substrate under the antifuse unit, and the well is connected to the doped region 218, where the conductive types of the well 236 and the doped region 218 are the same, so as to improve a reading characteristic. In this way, when the read operation is performed to the antifuse memory cell, the read operation can be implemented through a lower voltage. When the programming operation is performed to the antifuse memory cell, a PGM inhibit current is decreased, and a leakage current is improved during inhibit programming.

Referring to FIG. 2C, a method for manufacturing the memory cell of an exemplary embodiment of the invention is described below. In the present embodiment, the steps of the method for manufacturing the memory cell are the same to the steps of the method shown in FIG. 1D, so that details thereof are not repeated, and only differences there between are described below.

First, the well 204 and the well 236 are respectively formed in the substrate 202, where the conductive types of the well 204 and the well 236 are different. The antifuse structure 232 composed of the antifuse layer 210 and the antifuse gate 212 and the select gate structure 234 composed of the gate dielectric layer 222 and the select gate 220 are formed on the substrate 202. In the step of forming the gate dielectric layer 210, the thickness D1 of the gate dielectric layer 222 close to the antifuse layer 210 is greater than the thickness D2 of the gate dielectric layer 222 away from the antifuse layer 210.

The source/drain extension 228 is formed at a side of the select gate 220. Then, the lightly doped region 226 is formed at another side of the select gate 220.

Then, the doped region 216 and the doped region 218 are formed in the substrate 202 at two opposite sides of the antifuse gate 212, and the doped region 218 and the doped region 224 are formed in the substrate 202 at two opposite sides of the select gate 220. A part of the well 236 extends to the bottom of the doped region 218.

However, in the antifuse memory cell of the invention, as shown in FIG. 1B-FIG. 1D and FIG. 2A-FIG. 2C, the antifuse gate 212, the antifuse layer 210 and the modified extension doped region 214 (the well 236) form a varactor. By using the modified extension doped region 214 (the well 236) to connect the doped region 218, where the conductive types of the modified extension doped region 214 (the well 236) and the doped region 218 are the same, even if the rupture position of the antifuse layer is formed at a position far away from the doped region 218, the current can be conducted to the doped region 218 through the modified extension doped region 214 (the well 236), by which performance of the antifuse memory cell is ameliorated. When the read operation is performed to the antifuse memory cell, the read operation can be implemented through a lower voltage.

Moreover, since the modified extension doped region 214 (the well 236) is disposed in the substrate 202 below the antifuse unit 206, direct contact between the antifuse gate and the substrate after rupture of the antifuse layer is avoided, and when the programming operation is performed to the antifuse memory cell, the PGM inhibit current can be decreased.

Moreover, when the select transistor is an I/O MOS transistor, the thickness of the gate dielectric layer 222 is, for example, 50 Å-70 Å, which is greater than the thickness of the antifuse layer 210, such that the leakage current can be decreased during inhibit programming. When the select transistor is a dual gate dielectric layer MOS transistor, the thickness of the gate dielectric layer 222 close to the antifuse layer 210 is, for example, 50 Å-70 Å, which is greater than the thickness of the antifuse layer 210, such that the leakage current can be decreased during inhibit programming.

In the antifuse memory cell of the invention, as shown in FIG. 1B-FIG. 1D, the junction depth of the lightly doped region 226 is greater than the junction depth of the source/drain extension region of the core MOS transistor, and the doping concentration of the lightly doped region 226 is smaller than the doping concentration of the source/drain extension region of the core MOS transistor, so that the junction BVD (the breakdown voltage of the drain to substrate junction) is improved, and the program leakage current is improved. Moreover, the lightly doped drain (IOLDD) of the I/O MOS transistor can be directly used as the lightly doped region 226.

Moreover, when the select transistor is an I/O MOS transistor, and the well 236 further extends to the bottom of the select gate from the substrate 202 under the antifuse unit 206 (shown in FIG. 2A-FIG. 2B), the leakage current can also be decreased during inhibit programming.

Figure 3:
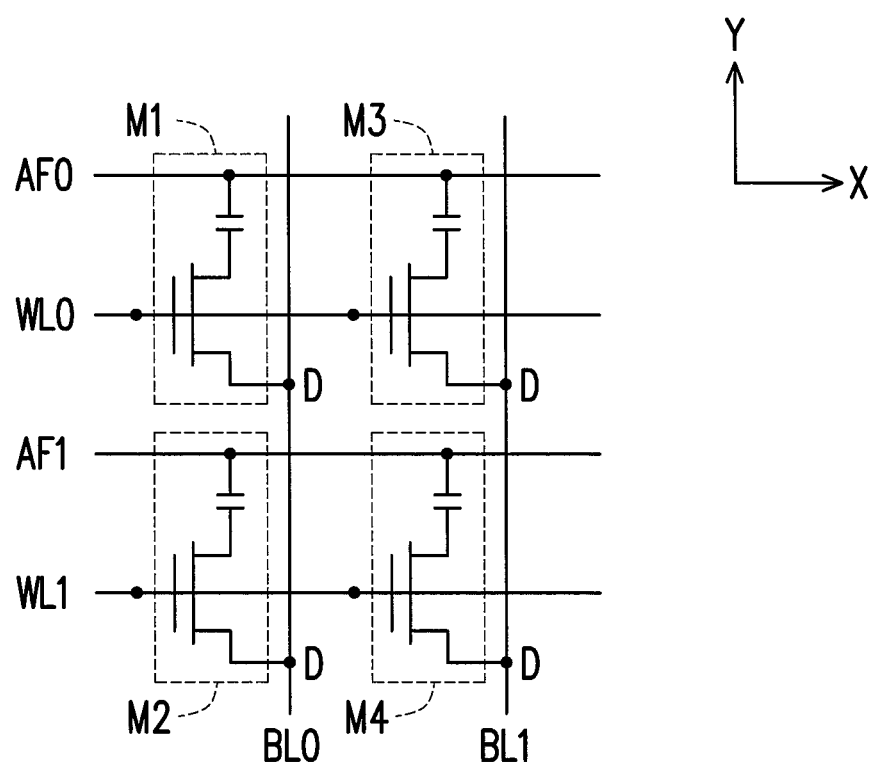
FIG. 3 is a circuit schematic diagram of an antifuse memory cell array according to an exemplary embodiment of the invention.

FIG. 3 is a circuit schematic diagram of an antifuse memory cell array according to an exemplary embodiment of the invention.

Referring to FIG. 3, the antifuse memory of the invention is composed of a plurality of memory cell arrays, and the memory cell array is described below. In the present embodiment, a memory cell array composed of 2*2 memory cells is taken as an example for descriptions, though the number of the memory cells of the memory cell array can be varied according to an actual requirement, for example, the memory cell array is composed of 64 memory cells, 256 memory cells, or 512 memory cells. In FIG. 3, an X-direction is defined as a row direction, and a Y-direction is defined as a column direction.

The memory cell array includes a plurality of memory cells M1-M4, a plurality of word lines WL0-WL1, a plurality of antifuse gate lines AF0-AF1, and a plurality of bit lines BL0-BL1.

Each of the memory cells M1-M4 has a structure as that shown in FIG. 1B-FIG. 1D (or FIG. 2A-FIG. 2C), and details thereof are not repeated.

The word lines WL0-WL1 are disposed on the substrate in parallel, and extend along the row direction (the X-direction). The word lines WL0-WL1 are respectively connected to the select gates of the memory cells of the same row. For example, the word line WL0 is connected to the select gates of the memory cells M1 and M3, and the word line WL1 is connected to the select gates of the memory cells M2 and M4.

The antifuse gate lines AF0-AF1 are disposed on the substrate in parallel, and extend along the row direction (the X-direction). The antifuse gate lines AF0-AF1 are respectively connected to the antifuse gates of the memory cells of the same row. For example, the antifuse gate line AF0 is connected to the antifuse gates (for example, the antifuse gate 212 shown in FIG. 1B) of the memory cells M1 and M3, and the antifuse gate line AF1 is connected to the antifuse gates of the memory cells M2 and M4.

A plurality of bit lines BL0-BL1 a disposed on the substrate in parallel, and extend along the column direction (the Y-direction). The bit lines BL0-BL1 are respectively connected to the doped regions of the memory cells of the same column. For example, the bit line BL0 is connected to the doped regions D (for example, the doped region 224 shown in FIG. 1B-FIG. 1D and FIG. 2A-FIG. 2C) of the memory cells M1 and M2, and the bit line BL1 is connected to the doped regions D of the memory cells M3 and M4.

An operating method of the antifuse memory of the invention is described below, which includes a programming mode and a data reading mode, etc. An exemplary embodiment is provided below to describe the operating method of the antifuse memory of the invention. However, the operating method of the antifuse memory of the invention is not limited to the aforementioned exemplary embodiment. In the following descriptions, the memory cell M1 in the figure is taken as an example for descriptions.

Figure 4A:
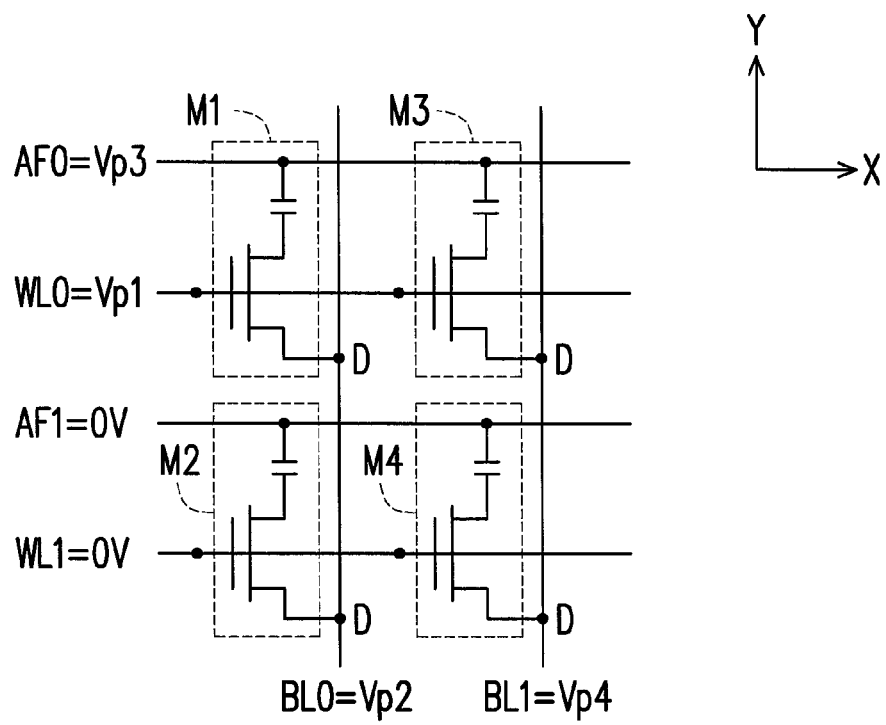
FIG. 4A is a schematic diagram of a memory cell array when a programming operation is performed.
Figure 4B:
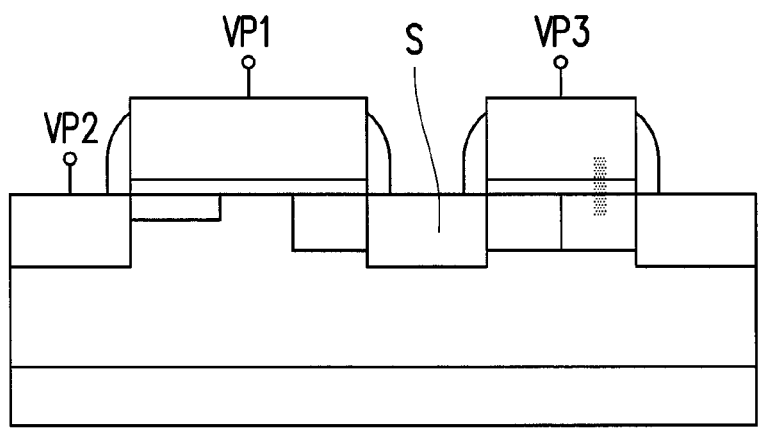
FIG. 4B is a cross-sectional view of a selected memory cell M1 when the programming operation is performed.

FIG. 4A is a schematic diagram of a memory cell array when a programming operation is performed. FIG. 4B is a cross-sectional view of the selected memory cell M1 when the programming operation is performed.

Referring to FIG. 4A and FIG. 4B, when the programming operation is performed on the selected memory cell M1, a voltage Vp1 is applied to the word line WL0 coupled to the selected memory cell M1, a voltage Vp2 is applied to the bit line BL0 coupled to the selected memory cell M1, and a voltage Vp3 is applied to the antifuse gate line AF0 coupled to the selected memory cell M1. A voltage Vp4 is applied to the bit line BL1. The voltage Vp1 is enough to turn on the channel of the select transistor. A voltage difference between the voltage Vp2 and the voltage Vp3 is enough to cause rupture of the antifuse layer below the antifuse gate of the selected memory cell M1 to form a conductive path. Moreover, the antifuse layers of the non-selected memory cells (M2~M4) are not ruptured because the corresponding select transistors of non-selected memory cells are turned off.

As shown in FIG. 4A, when the selected memory cell M1 is programmed, the voltage Vp1 applied to the word line WL0 turns on the channel of the select transistor. Therefore, the voltage Vp2 applied to the bit line BL0 reaches the bottom of the antifuse gate through the channel of the select transistor. Then, the voltage difference between the voltage Vp3 applied to the antifuse gate line AF0 and the voltage Vp2 applied to the bit line BL0 causes rupture of the antifuse layer, so as to program the selected memory cell M1.

In the present embodiment, the voltage Vp1 is, for example, about 0.7-3.5 volts; the voltage Vp2 is, for example, about 0 volt; the voltage Vp3 is, for example, about 4.5-12 volts; and the voltage Vp4 is, for example, about 0.7-3.5 volts.

During the aforementioned programming operation, regarding the non-selected memory cell M3 that shares the word line WL0 and the antifuse gate line AF0 with the memory cell M1, since the voltage difference between the voltage Vp4 applied to the bit line BL1 coupled to the non-selected memory cell M3 and the voltage Vp1 applied to the word line WL0 is not enough to turn on the corresponding select transistor of the non-selected memory cell M3, programming of the non-selected memory cell M3 is inhibited.

During the aforementioned programming operation, regarding the non-selected memory cell M2 that shares the bit line BL0 with the memory cell M1, since the voltage Vp2 is applied to the bit line BL0 coupled to the non-selected memory cell M2, and a ground voltage (0 volt) is applied to the non-selected word line WL1 and the antifuse gate line AF1, the channel region of the select gate of the non-selected memory cell M2 is turned off. Since there is not voltage difference between the antifuse gate and the substrate of the non-selected memory cell M2, rupture of the antifuse layer of the non-selected memory cell M2 is prevented, i.e. the non-selected memory cell M2 is not programmed.

During the aforementioned programming operation, regarding the non-selected memory cell M4, since the voltage VP4 is applied to the non-selected bit line BL1 coupled to the non-selected memory cell M4, and the ground voltage (0 volt) is applied to word line WL1 and the antifuse gate line AF1, the channel region of the select gate of the non-selected memory cell M4 is in the turn off state. Since there is not voltage difference between the antifuse gate AF and the substrate of the non-selected memory cell M4, rupture of the antifuse layer of the non-selected memory cell M4 is prevented, i.e. the non-selected memory cell M4 is not programmed.

During the process of the programming operation of the antifuse memory, although a single memory cell in the memory cell array is taken as a unit to implement the programming operation, the programming operation of the antifuse memory of the invention can be implemented while taking a byte, a sector or a block as a programming unit by controlling each of the word lines, each of the bit lines and each of the antifuse gate lines.

Figure 5A:
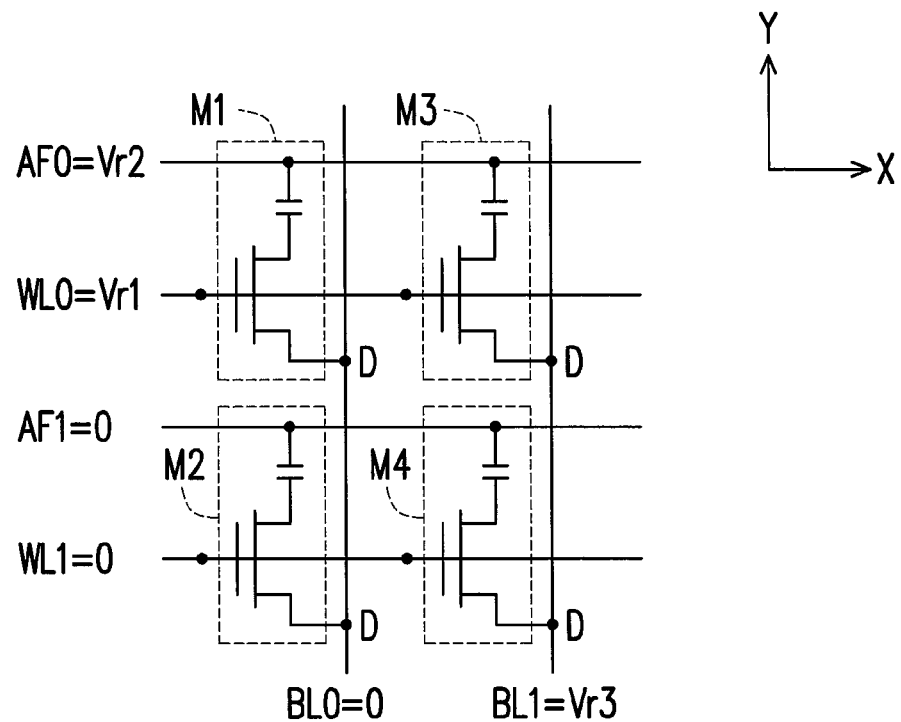
FIG. 5A is a schematic diagram of a memory cell array when a read operation is performed.
Figure 5B:
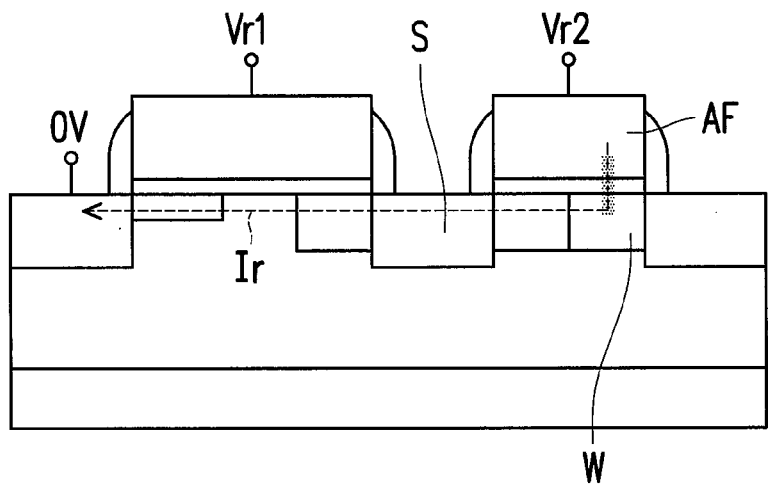
FIG. 5B is a cross-sectional view of the selected memory cell M1 when the read operation is performed.

FIG. 5A is a schematic diagram of a memory cell array when a read operation is performed. FIG. 5B is a cross-sectional view of the selected memory cell M1 when the read operation is performed.

Referring to FIG. 5A and FIG. 5B, when the read operation is performed to the selected memory cell M1, a voltage Vr1 is applied to the word line WL0 coupled to the selected memory cell M1, a voltage Vr2 is applied to the antifuse gate line AF0 coupled to the selected memory cell M1, and a voltage of 0 volt is applied to the bit line BL0 coupled to the selected memory cell M1. A voltage Vr3 is applied to the bit line BL1. The voltage Vr1 is enough to turn on the channel of the select transistor, and data stored in the memory cell M1 can be determined by detecting a channel current Ir of the memory through the bit line BL0 (the doped region).

In the present embodiment, the voltage Vr1 is, for example, about 0.7-3.5 volts, the voltage Vr2 is, for example, about 0.7-3.5 volts, and the voltage Vr3 is, for example, about 0.7-3.5 volts.

Figure 6A:
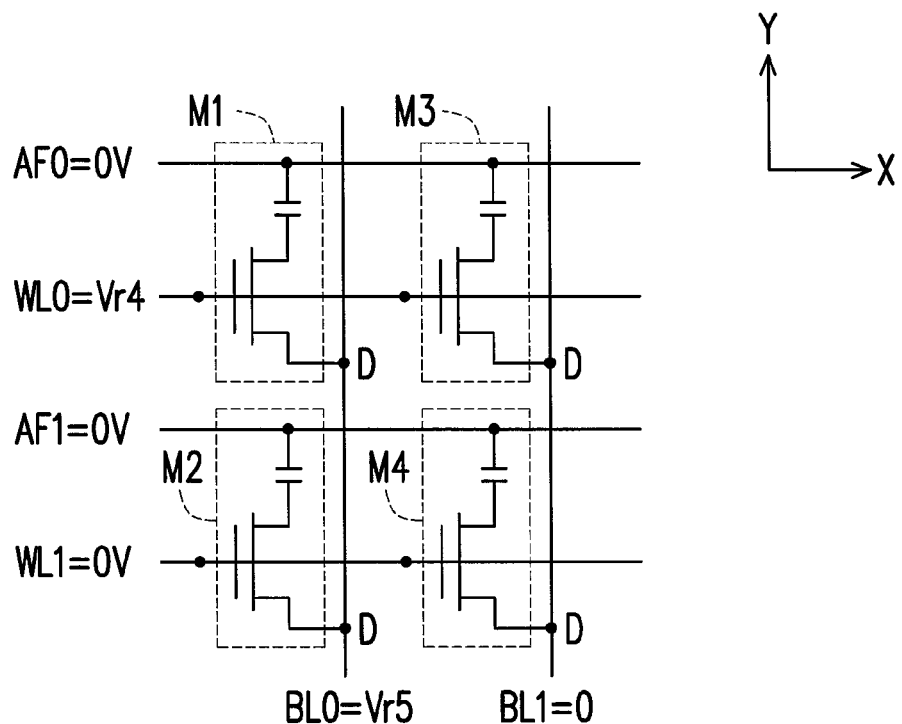
FIG. 6A is a schematic diagram of a memory cell array when a read operation is performed.
Figure 6B:
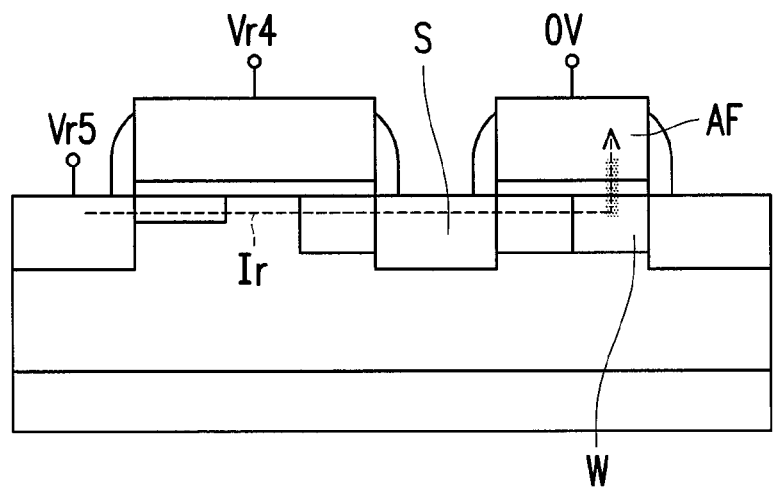
FIG. 6B is a cross-sectional view of the selected memory cell M1 when the read operation is performed.

FIG. 6A is a schematic diagram of a memory cell array when a read operation is performed. FIG. 6B is a cross-sectional view of the selected memory cell M1 when the read operation is performed.

Referring to FIG. 6A and FIG. 6B, when the read operation is performed to the selected memory cell M1, a voltage Vr4 is applied to the word line WL0 coupled to the selected memory cell M1, the ground voltage (0 volt) is applied to the antifuse gate line AF0 coupled to the selected memory cell M1, and a voltage Vr5 is applied to the bit line BL0 coupled to the selected memory cell M1. The voltage Vr4 is enough to turn on the channel of the select transistor, and data stored in the memory cell M1 can be determined by detecting a channel current Ir of the memory through the antifuse gate line AF0.

In the present embodiment, the voltage Vr4 is, for example, about 0.7-3.5 volts, and the voltage Vr5 is, for example, about 0.7-3.5 volts.

As shown in FIG. 5B and FIG. 6B, by connecting a modified extension doped region W (the well) with a doped region D, where conductive types of the modified extension doped region W (the well) and a doped region S are the same, even if the rupture position of the antifuse layer is formed at a position outside the doped region S, the current can be conducted to the doped region S through the modified extension doped region W (the well), so as to ameliorate the performance of the antifuse memory cell. When the read operation is performed to the antifuse memory cell, the read operation can be implemented through a lower voltage. Moreover, the antifuse memory cell of the invention may implement a forward read (FIG. 5A and FIG. 5B) and a reverse read (FIG. 6A and FIG. 6B).

In summary, in the antifuse OTP read only memory cell with performance improvement and the operating method of the memory, the modified extension doped region W (the well) is disposed in the substrate below the antifuse unit, and the modified extension doped region W (the well) is connected to the doped region S, where the conductive types of the modified extension doped region W (the well) and the doped region S are the same, even if the rupture position of the antifuse layer is formed at a position outside the doped region S, the current can be conducted to the doped region S through the modified extension doped region W (the well), so as to ameliorate the performance of the antifuse memory cell. When the read operation is performed to the antifuse memory cell, the read operation can be implemented through a lower voltage. By using the well, the antifuse gate is avoided to directly contact the substrate after the antifuse layer is ruptured, and when the antifuse memory cell is programmed, the PGM inhibit current is decreased during inhibit programming. Further, by the lightly doped region of the select transistor, the program leakage current is improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An antifuse one time programmable memory cell with performance improvement, comprising:
   an antifuse unit, disposed on a substrate, wherein the substrate has a first conductive type, and the antifuse unit comprises:
      an antifuse gate, disposed on the substrate;
      an antifuse layer, disposed between the antifuse gate and the substrate;
      a modified extension doped region, having a second conductive type, and disposed in the substrate below the antifuse layer, wherein the antifuse layer, the antifuse gate and the modified extension doped region form a varactor; and
      a first doped region and a second doped region, having the second conductive type, and respectively disposed in the substrate at two opposite sides of the antifuse gate;
   a select transistor, disposed on the substrate and comprising:
      a select gate, disposed on the substrate;
      a gate dielectric layer, disposed between the select gate and the substrate; and
      the second doped region and a third doped region, having the second conductive type, and respectively disposed in the substrate at two opposite sides of the select gate.

2. The antifuse one time programmable memory cell with performance improvement as claimed in claim 1, wherein a thickness of the antifuse layer is the same to a thickness of the gate dielectric layer.

3. The antifuse one time programmable memory cell with performance improvement as claimed in claim 1, wherein the select transistor is a core metal oxide semiconductor transistor.

4. The antifuse one time programmable memory cell with performance improvement as claimed in claim 3, wherein the select transistor further comprises:
   a lightly doped region, having the second conductive type, and disposed between the select gate and the second doped region, wherein a junction depth of the lightly doped region is the same to a junction depth of the modified extension doped region, and a doping concentration of the lightly doped region is the same to a doping concentration of the modified extension doped region; and
   a source/drain extension, having the second conductive type, and disposed between the select gate and the third doped region, wherein a junction depth of the source/drain extension is smaller than a junction depth of the modified extension doped region, and a doping concentration of the source/drain extension is greater than the doping concentration of the modified extension doped region.

5. The antifuse one time programmable memory cell with performance improvement as claimed in claim 1, wherein the select transistor is an input/output metal oxide semiconductor transistor.

6. The antifuse one time programmable memory cell with performance improvement as claimed in claim 5, wherein the select transistor further comprises:
- a lightly doped region, having the second conductive type, and disposed between the select gate and the second doped region; and
- a source/drain extension, having the second conductive type, and disposed between the select gate and the third doped region,
- wherein junction depths of the lightly doped region, the source/drain extension and the modified extension doped region are the same, and doping concentrations of the lightly doped region, the source/drain extension and the modified extension doped region are the same.

7. The antifuse one time programmable memory cell with performance improvement as claimed in claim 1, wherein the select transistor is a dual gate dielectric layer metal oxide semiconductor transistor, and a thickness of the gate dielectric layer close to the second doped region is greater than a thickness of the gate dielectric layer close to the third doped region.

8. The antifuse one time programmable memory cell with performance improvement as claimed in claim 7, wherein the select transistor further comprises:
- a lightly doped region, having the second conductive type, and disposed between the select gate and the second doped region, wherein a junction depth of the lightly doped region is the same to a junction depth of the modified extension doped region, and a doping concentration of the lightly doped region is the same to a doping concentration of the modified extension doped region; and
- a source/drain extension, having the second conductive type, and disposed between the select gate and the third doped region, wherein a junction depth of the source/drain extension is smaller than a junction depth of the modified extension doped region, and a doping concentration of the source/drain extension is greater than the doping concentration of the modified extension doped region.

9. The antifuse one time programmable memory cell with performance improvement as claimed in claim 1, wherein the first conductive type is one of a P-type and an N-type, and the second conductive type is another one of the P-type and the N-type.

10. The antifuse one time programmable memory cell with performance improvement as claimed in claim 1, wherein the modified extension doped region is a well.

11. The antifuse one time programmable memory cell with performance improvement as claimed in claim 10, wherein a part of the well extends to the bottom of the select gate.

12. The antifuse one time programmable memory cell with performance improvement as claimed in claim 11, wherein the select transistor is a core metal oxide semiconductor transistor.

13. The antifuse one time programmable memory cell with performance improvement as claimed in claim 12, wherein the select transistor further comprises:
- a lightly doped region, having the second conductive type, and disposed between the select gate and the third doped region.

14. The antifuse one time programmable memory cell with performance improvement as claimed in claim 11, wherein the select transistor is an input/output metal oxide semiconductor transistor.

15. The antifuse one time programmable memory cell with performance improvement as claimed in claim 14, wherein the select transistor further comprises:
- a lightly doped region, having the second conductive type, and disposed between the select gate and the third doped region.

16. The antifuse one time programmable memory cell with performance improvement as claimed in claim 10, wherein a part of the well extends to the bottom of the second doped region.

17. The antifuse one time programmable memory cell with performance improvement as claimed in claim 16, wherein the select transistor is a dual gate dielectric layer metal oxide semiconductor transistor, and a thickness of the gate dielectric layer close to the second doped region is greater than a thickness of the gate dielectric layer close to the third doped region.

18. The antifuse one time programmable memory cell with performance improvement as claimed in claim 17, wherein the select transistor further comprises:
- a lightly doped region, having the second conductive type, and disposed between the select gate and the second doped region; and
- a source/drain extension, having the second conductive type, and disposed between the select gate and the third doped region, wherein a junction depth of the source/drain extension is smaller than a junction depth of the lightly doped region, and a doping concentration of the source/drain extension is greater than the doping concentration of the lightly doped region.

19. An operating method of a memory cell, the memory cell comprising a select transistor disposed on a substrate, and an antifuse unit connected to the select transistor in series, wherein the antifuse unit comprises an antifuse layer and an antifuse gate disposed on the substrate in sequence, a modified extension doped region disposed in the substrate below the antifuse layer, and a first doped region and a second doped region disposed in the substrate at two opposite sides of the antifuse gate, and the antifuse layer, the antifuse gate and the modified extension doped region form a varactor; the select transistor comprises a select gate, and a second doped region and a third doped region respectively disposed in the substrate at two opposite sides of the select gate, and the operating method of the memory cell comprising:
- in a read operation, applying a first voltage to the select gate, applying a second voltage to the third doped region and applying a third voltage to the antifuse gate, wherein the first voltage is enough to turn on a channel of the select transistor, and data stored in the memory cell is determined by detecting a channel current of the memory cell through the antifuse gate.

20. The operating method of the memory cell as claimed in claim 19, wherein the first voltage is equal to the third voltage, and the second voltage is 0V.

21. An operating method of a memory, the memory comprising a plurality of memory cells arranged in an array, each of the memory cells comprising a select transistor disposed on a substrate, and an antifuse unit connected to the select transistor in series, wherein the antifuse unit comprises an antifuse layer and an antifuse gate disposed on the substrate in sequence, a modified extension doped region disposed in the substrate below the antifuse layer, and a first doped region and a second doped region respectively disposed in the substrate at two opposite sides of the antifuse gate, the antifuse gate, the antifuse layer and the modified extension doped region form a varactor; the select transistor comprises a select gate, and a second doped region and a third doped region respectively disposed in the substrate at two opposite sides of the select gate; a plurality of word lines respectively connected to the select gate of the memory cells of the same row; a plurality of antifuse gate lines respectively connected to the antifuse gate of the memory cells of the same row; a plurality of bit lines respectively connected to the third doped region of the memory cells of a same row, the operating method of the memory cell comprising:

in a read operation, applying a first voltage to the word line coupled to the selected memory cell, applying a second voltage to the bit line coupled to the selected memory cell and applying a third voltage to the antifuse gate line to the selected memory cell, wherein the first voltage is enough to turn on a channel of the select transistor of the selected memory cell, and data stored in the selected memory cell is determined by detecting a channel current of the selected memory cell through the antifuse gate coupled to the selected memory cell.

22. The operating method of the memory as claimed in claim 21, wherein the first voltage is equal to the third voltage, and the second voltage is 0V.

\* \* \* \* \*